United States Patent [19]
Akimoto et al.

[11] Patent Number: 5,844,662
[45] Date of Patent: Dec. 1, 1998

[54] RESIST PROCESSING APPARATUS AND A RESIST PROCESSING METHOD

[75] Inventors: Masami Akimoto, Kumamoto; Hikaru Itoh, Yokohama, both of Japan

[73] Assignee: Tokyo Electron Limited, Tokyo, Japan

[21] Appl. No.: 686,707

[22] Filed: Jul. 25, 1996

[30] Foreign Application Priority Data

Jul. 28, 1995 [JP] Japan .................................. 7-212857

[51] Int. Cl.$^6$ .............................. G03B 27/32; E05D 7/00
[52] U.S. Cl. .............................................. 355/27; 354/319
[58] Field of Search ................................ 355/72, 75, 27; 396/612; 354/319

[56] References Cited

U.S. PATENT DOCUMENTS

| | | | |
|---|---|---|---|
| 5,177,514 | 1/1993 | Ushijima et al. | 354/319 |
| 5,339,128 | 8/1994 | Tateyama et al. | 354/317 |
| 5,434,644 | 7/1995 | Kitano et al. | 355/30 |
| 5,442,416 | 8/1995 | Tateyama et al. | 396/612 |
| 5,516,626 | 5/1996 | Ohmi et al. | 430/328 |
| 5,580,607 | 12/1996 | Takekuma et al. | 427/240 |
| 5,626,675 | 5/1997 | Sakamoto et al. | 118/663 |
| 5,626,913 | 5/1997 | Tomoeda et al. | 427/299 |
| 5,718,763 | 2/1998 | Tateyama et al. | 118/52 |

FOREIGN PATENT DOCUMENTS 2 217 107   10/1989   United Kingdom .

*Primary Examiner*—Russell Adams
*Assistant Examiner*—Henry Hung Nguyen
*Attorney, Agent, or Firm*—Oblon, Spivak, McClelland, Maier & Neustadt, P.C.

[57] ABSTRACT

The resist processing apparatus comprises a loader/unloader section provided with a plurality of cassettes, a first convey mechanism provided in the loader/unloader section, and for taking out an unprocessed substrate from the cassette, and for putting a processed substrate into the cassette, a first processing section provided at one side of the loader/unloader section and having a resist coating section for coating a resist to the substrate, a second processing section provided at another side of the loader/unloader section to be apart from the first processing section, and having a development processing section for developing the resist coated to the substrate, a second convey mechanism for receiving an unprocessed substrate from the first convey mechanism, for conveying the unprocessed substrate to the first processing section, and for delivering the substrate coated with a resist by the resist coating section, to the first convey mechanism, and a third convey mechanism for receiving an unprocessed substrate from the first convey mechanism, for conveying the unprocessed substrate to the second processing section, and for delivering the substrate developed by the development processing section, to the first convey mechanism.

13 Claims, 5 Drawing Sheets

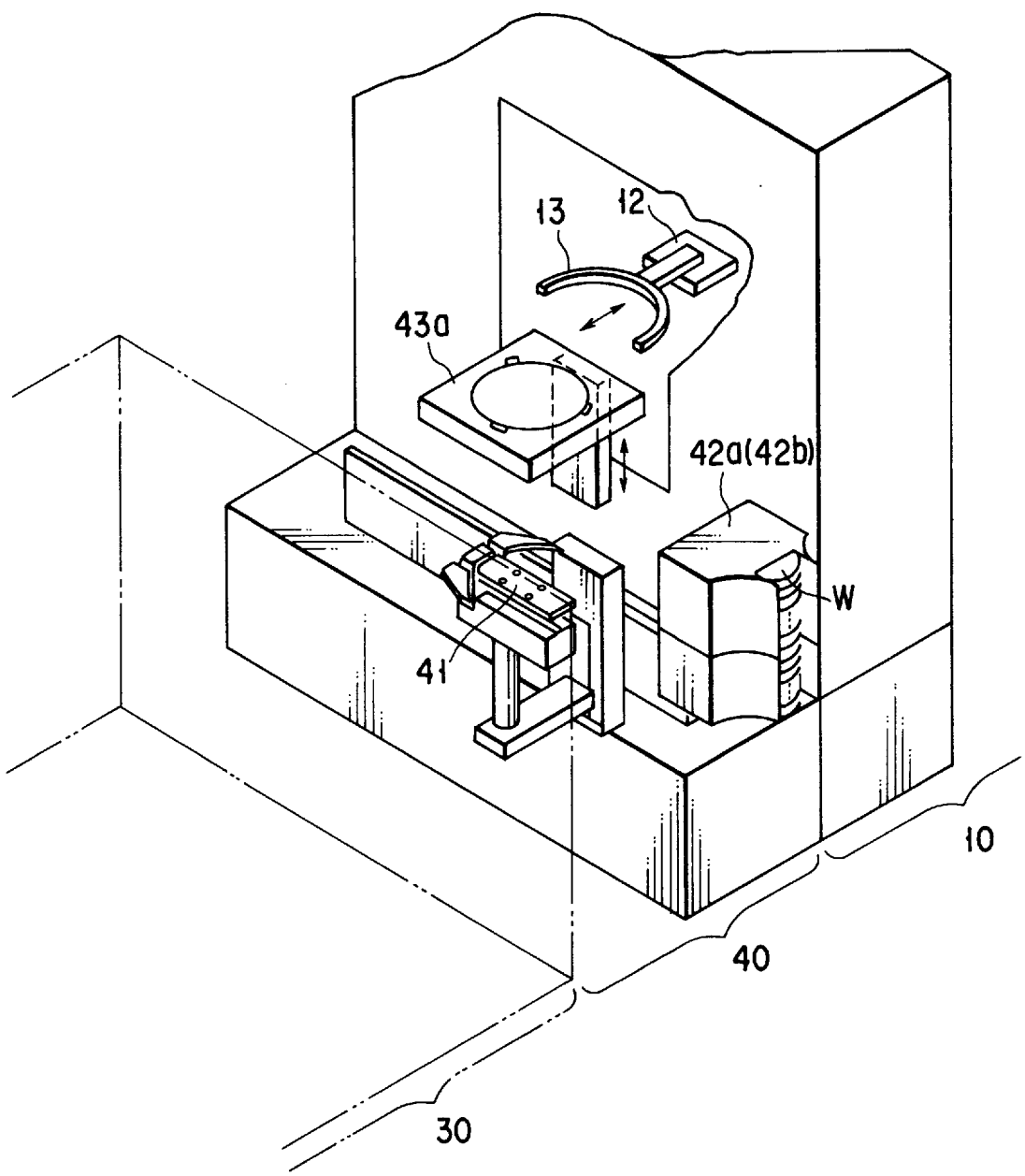
F I G. 2

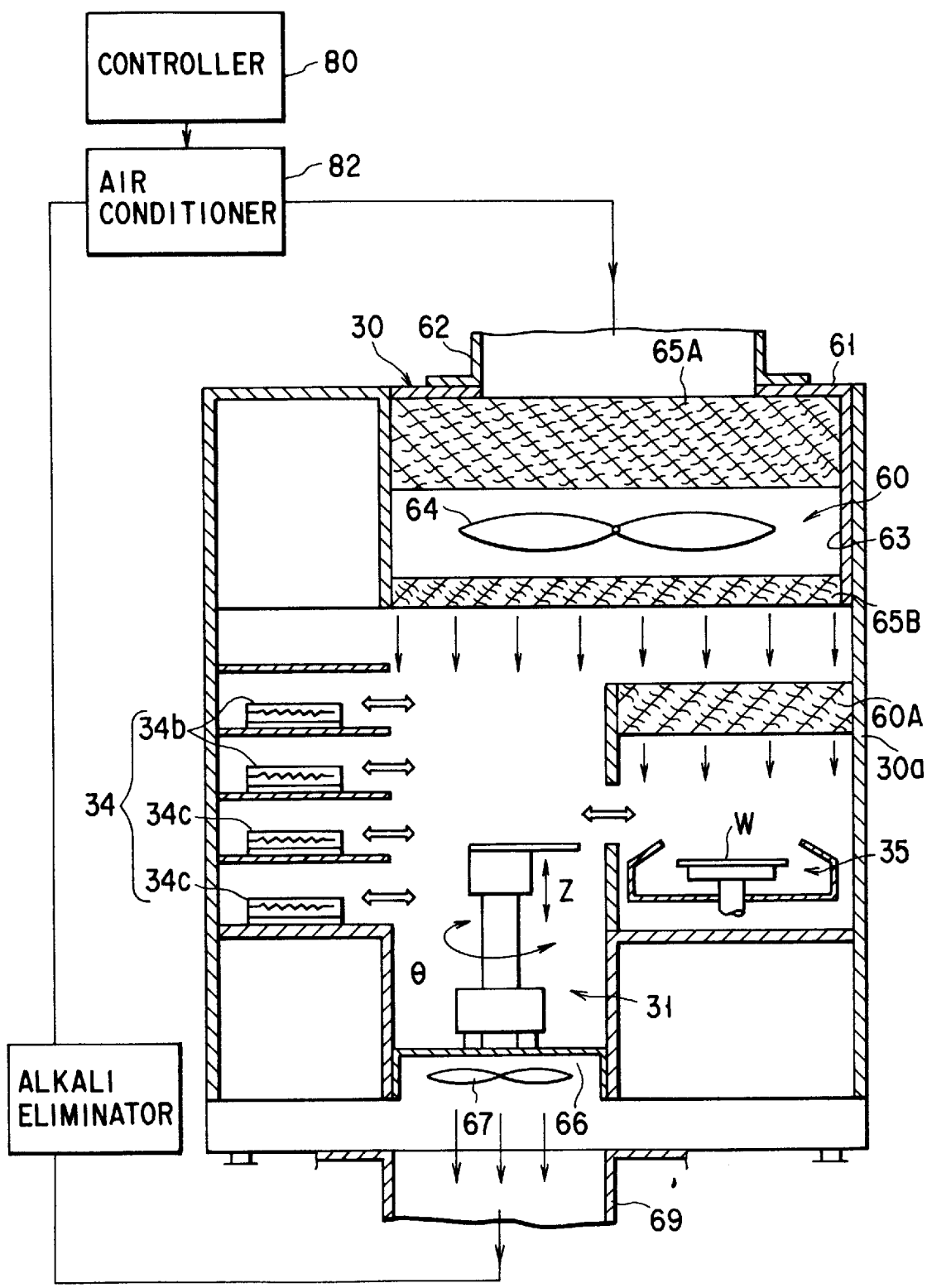
F I G. 3

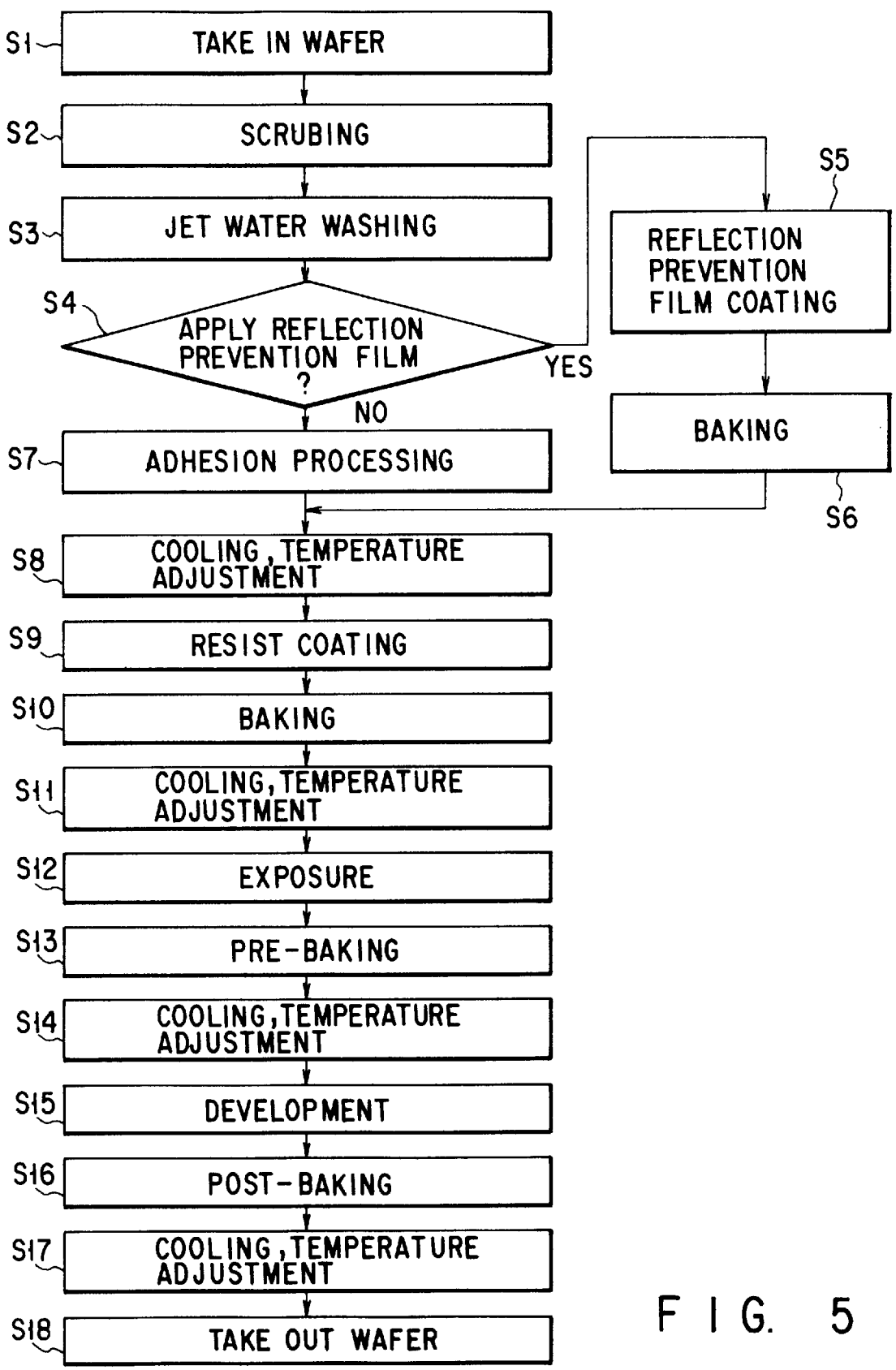
F I G. 5

5,844,662

RESIST PROCESSING APPARATUS AND A RESIST PROCESSING METHOD

BACKGROUND OF THE INVENTION

1. Field of the Invention

The present invention relates to a resist processing apparatus and a resist processing method for coating a resist onto a semiconductor wafer and a substrate such as an LCD substrate and for developing thereon.

2. Description of the Related Art

In steps of manufacturing a semiconductor device, a photo-resist is coated on a semiconductor wafer, and a circuit pattern of a minified size is formed by a photo-lithography technique. Further, the applied resist is exposed with light, and is then subjected to development processing. This series of resist processing steps is a very significant process for the purpose of high integration of a semiconductor device. Apparatuses for performing the series of resist processing steps are, for example, a resist coating apparatus, an exposure apparatus, and a development apparatus.

However, in a conventional resist processing system in which the resist coating, the exposure processing, and the development processing are respectively performed by separate apparatuses, cassette stations are respectively provided for a resist coating apparatus, a development apparatus, and the like, and therefore, the system must have a large size. In addition, circuit patterns formed by conventional resist processing steps easily have differences in its line width, so that a highly integrated circuit cannot be formed with a high accuracy and a high precision.

SUMMARY OF THE INVENTION

The present invention has an object of providing a resist processing apparatus and a resist processing method in which the entire system can have a compact size.

The present invention has another object of providing a resist processing apparatus and a resist processing method in which resist processing of a high accuracy can be performed without substantially causing an interference between processing steps with each other.

The following is estimated as a factor which prevents circuit patterns from attaining accurate and precise line widths. Firstly, it is considered that alkali components such as amine and the like are generated since an amine-based solvent is used in adhesion processing before coating a resist, and those components make bad influences on the reaction between the resist and a developer solution, thereby resulting in variations in the line widths. Secondly, since an amine-based solvent is used to form a reflection prevention film for preventing abnormal exposure, bad influences are made on the development processing in the same manner as above.

Therefore, in order to solve the above problem, the resist processing apparatus according to the present invention comprises; a loader/unloader section provided with a plurality of cassettes; a first convey mechanism provided in the loader/unloader section, and for taking out an unprocessed substrate from the cassette, and for putting a processed substrate into the cassette; a first processing section provided at one side of the loader/unloader section and having a resist coating section for coating a resist to the substrate; a second processing section provided at another side of the loader/unloader section to be apart from the first processing section, and having a development processing section for developing the resist applied to the substrate; a second convey mechanism for receiving an unprocessed substrate from the first convey mechanism, for conveying the unprocessed substrate to the first processing section, and for delivering the substrate coated with a resist by the resist coating section, to the first convey mechanism; and a third convey mechanism for receiving an unprocessed substrate from the first convey mechanism, for conveying the unprocessed substrate to the second processing section, and for delivering the substrate developed by the development processing section, to the first convey mechanism.

Meanwhile, the resist processing method according to the present invention comprises: (a) a washing step of washing a substrate; (b) a resist coating step of coating a resist to the washed substrate; (c) a baking step of baking the coated resist; (d) an exposure step of exposing the coated resist with light; and (e) a development step of developing the coated resist at a place sufficiently apart from a place where the resist coating step (b) is executed, so that an atmosphere of the resist coating step (b) does not make substantially influences.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a schematic perspective view showing the part of a loader/unloader portion;

FIG. 3 is a longitudinal cross-sectional view showing a processing section including a development unit;

FIG. 5 is a flow-chart showing a resist processing method according to an embodiment of the present invention.

DETAILED DESCRIPTION OF THE PREFERRED EMBODIMENTS

In the following, preferred embodiments of the present invention will be explained with reference to the drawings. In the following embodiments, explanation will be made to an example in which a resist processing apparatus of the present invention is adopted in a resist coating/development processing system.

Figure 1:
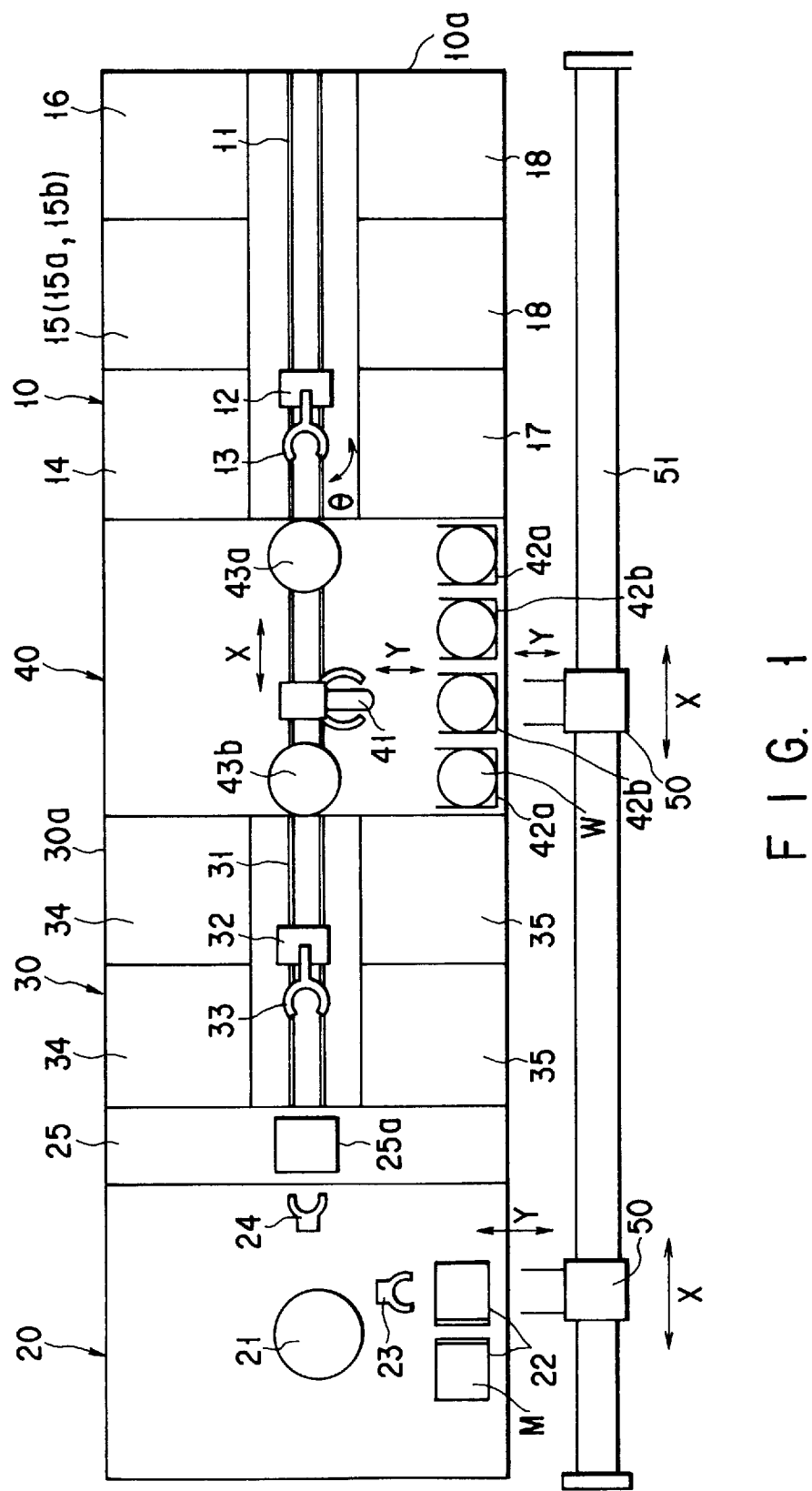
FIG. 1 is a schematic plan view showing a resist processing apparatus according to the present invention.
Figure 6:
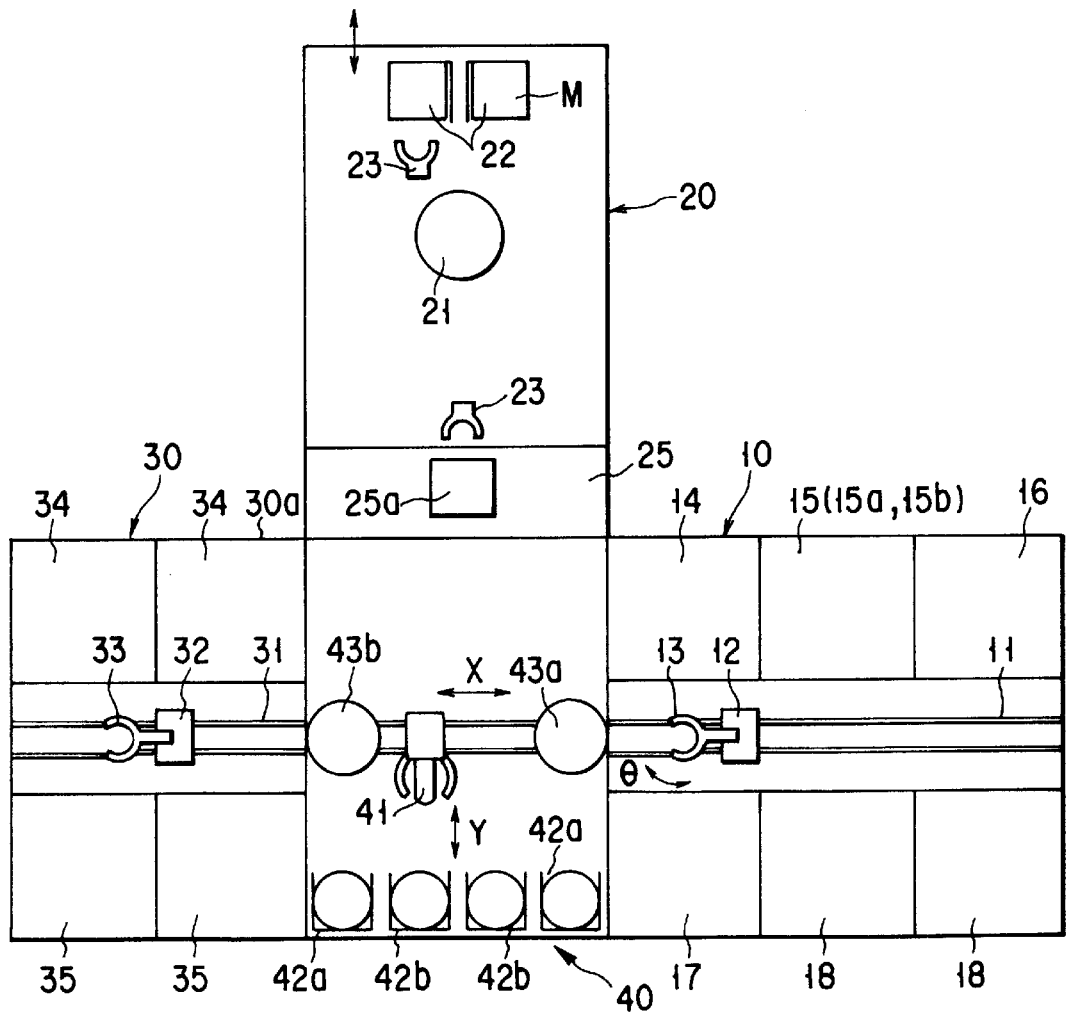
FIG. 6 is a schematic plan view showing a resist processing apparatus according to another embodiment of the present invention.

As shown in FIG. 1, a resist coating/development processing system comprises a first processing section 10, a second processing section 30, a loader/unloader section 40, and an exposure section 20. The loader/unloader section 40 is provided between the first processing section 10 and the second processing section 30, and both processing sections 10 and 30 are positioned apart from each other by the loader/unloader section 40. The exposure processing section 20 is connected to the second processing section 30 through an interface section 25. However, the exposure processing section 20 may be connected to the loader/ unloader section 40 through the interface section 25, as shown in FIG. 6. These processing sections 10, 20, 30, and 40 may be connected to each other such that these processing sections are attachable to and detachable from each other, by a connection mechanism (not shown).

A guide rail 51 is provided along the processing sections 10, 20, 30, and 40 disposed in series in the X-axis direction. A plurality of convey robots 50 are provided on the guide rail 51, and these convey robots 50 convey first and second cassettes 42a and 42b into and from the loader/unloader section 40. The covey robots 50 each comprise, for example, a ball screw mechanism, a belt mechanism, a linear motor, an air convey mechanism, and the likes.

Two kinds of cassettes 42a and 42b are placed on the station of the loader/unloader section 40. Twenty five unprocessed semiconductor wafers W are set in the first cassette 42a. Processed wafers W are set in the second cassette 42b. A first convey mechanism 41 is provided such that this mechanism can run along a center passage 31 of the loader/unloader section 40.

The first processing section 10 comprises a second convey mechanism 12 movable along a center passage 11 of a box member 10a of the first processing section 10. The second convey mechanism 12 has an arm 13, and the arm 13 is movable in the X-axis, Y-axis, and Z-axis directions and is rotatable by θ turns around the Z-axis. A brush wash section 14, an adhesion/cooling section 15, and a bake section (or first heat processing section) 16 are provided at one side of the center passage 11, while a jet wash section 17 and two resist coating sections 18 are provided at the other side of the center passage 11. The adhesion/cooling section 15 has an adhesion unit section 15a positioned at an upper portion of the section 15 and a cooling unit section 15b positioned at a lower portion thereof. Specifically, the adhesion section 15a and the cooling section 15b are layered in a plurality of stages in the vertical direction.

The exposure processing section 20 is connected to the second processing section 30 through an interface section 25 for delivering wafers W. The exposure processing section 20 is provided with a wafer mount base 21, and a light irradiation means (not shown). In addition, a cassette 22 for containing a mask M is provided at one side of the exposure processing section 20. The exposure processing section 20 comprises two convey arms 23 and 24. The convey arm 23 is used to delivery a mask M between the cassette 22 and the wafer mount base 21. The other convey arm 24 is used to delivery wafers W between the wafer mount base 21 and the interface section 25. Each of the convey arms 23 and 24 is movable in the X-axis, Y-axis, and Z-axis directions, and is rotatable by θ turns around the Z-axis.

The second processing section 30 comprises a third convey mechanism 32 which is movable along the center convey passage 31 of the box member 30a. The third convey mechanism 32 comprises a wafer convey arm 33 which is movable in the X-axis, Y-axis, and Z-axis directions and is rotatable by θ turns around the Z-axis. Two bake sections (second heat processing sections) 34 are provided at one side of the center passage 31, while two development sections 35 are provided at the other side of the center passage 31. Note that pre-bake processing for chemically sensitizing a resist film after exposure is performed in the bake sections 34. In the development sections 35, a developer solution for developing a resist film after pre-baking is applied to wafers W.

In the next, the second processing section 30 will be more specifically with reference to FIG. 3.

Side and upper portions of the first and second processing sections 10 and 30 are covered with covers 10a and 30a, and are arranged such that clean air is supplied into the processing sections through an upper duct 62 from an air conditioner 82. The power source circuit of the air conditioner 82 is connected to a controller 80, and operation of the circuit is controlled by this controller 80.

The opening of the upper duct 62 is provided with filters 65A and 65B, and a fan 64 is provided between the filters 65A and 65B. The filters 65A and 65B are ULPA filters for eliminating fine particles. The fan 64 creates a down-flow of clean air which flows toward the development section 35.

Figure 4:
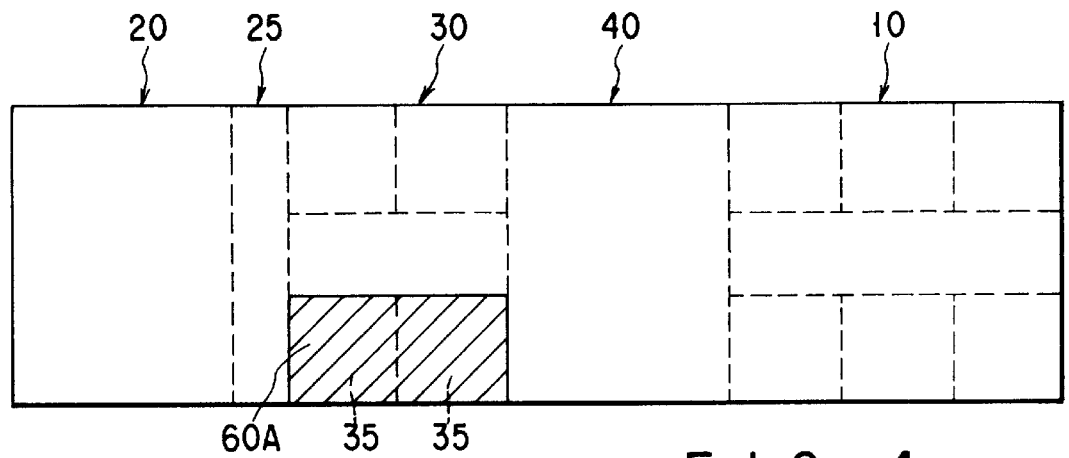
FIG. 4 is a schematic plan view showing a mount area of a chemical filter.

As shown in FIGS. 3 and 4, a chemical filter 60A is provided at an upper portion of the development section 35. The chemical filter 60A comprises a filter element capable of eliminating alkali components such as amine. This kind of chemical filter 60A and the ULPA filters 65A and 65B are disclosed in the specification of U. S. patent application No. 08/245,668 (filed on May 18, 1994).

An exhaust passage 66 is provided at the bottom portion of the center convey passage 31, and an exhaust fan 67 is provided in the exhaust passage 66. The exhaust passage 66 communicates with n exhaust duct 69. Further, the exhaust duct 69 communicates with the air conditioner 82 through an alkali eliminator 81. Specifically, one air circulation circuit is constituted by the air conditioner 82, a supply duct 62, the processing sections 10 and 30, and the exhaust duct 69. Note that the bake section 34 comprises two adhesion sections 34b provided at an upper portion of the section 34 and two cooling sections 34c at a lower portion thereof.

As shown in FIG. 1, four cassettes 42a and 42b are placed at the loader/unloader section 40 of the cassette convey passage 51. Among the four cassettes, two cassettes 42a contain unprocessed wafers W, while the other two cassettes 42b contain processed wafers W. Note that the loader/unloader section 40 comprises two positioning mount bases 43a and 43b. The mount base 43a is provided near the first processing section 10, and the other mount base 43b is provided near the second processing section 30.

In this loader/unloader section 40, for example, an unprocessed wafer W is taken out by the first convey mechanism 41 and is moved onto the mount base 43a. Or, a wafer W applied with a resist is received from the mount base 43a by the first convey mechanism 41 and is moved onto the other mount base 43b. Or, a wafer W subjected to exposure processing and development processing is received from the mount base 43b by convey mechanism 41 and is moved to the cassette 42b.

In the next, a case of subjecting a wafer W to resist processing with use of the apparatus as described above will be explained with reference to FIG. 5.

At first, an unprocessed wafer W is taken out from the cassette 42a by the first convey mechanism 41 and is placed on the mount base 43a. The center of the wafer W is aligned with the first processing section 10. Next, the wafer W is conveyed into the first processing section 10 by the second convey mechanism 12 (in a step S1). Further, the wafer W is subjected to brush washing by the brush wash section 14 (in a step S2), and is subjected to jet water washing by the jet water washing section 17 (in a step S3).

After jet water washing, the controller 80 determines whether or not a reflection prevention film is applied to the wafer W (in a step S4). If the determination result is YES, a reflection prevention film is applied to the wafer W in a resist coating section 18 (in a step S5). This reflection prevention film is made of a mixture compound including grains of a low reflection rate, such as grains of carbon black, as a main component. Further, the wafer W is conveyed into the bake section 16, and the applied reflection prevention film is subjected to baking (in a step S6).

Otherwise, if the determination result of the step S4 is NO, the wafer W is subjected to adhesion processing in the adhesion processing section 15a (in a step S7). Next, the wafer W cooled in the cooling section 15b to adjust the temperature (in a step S8). Further, a resist is coated to the wafer W in the resist coating section 18 (in a step S9). The wafer W is conveyed into the bake section 16, and the coated resist is baked (in a step S10). Next, the wafer W is cooled in the cooling section 15b to adjust the temperature (in a step S11).

The wafer W is placed on the mount base 43a by the second convey mechanism 12. Further, this wafer W is placed on the other mount base 43b by the first convey mechanism 41, and the center of the wafer W is aligned with respect to the second processing section 30. Next, the wafer W is conveyed into the second processing section 30 by the third convey mechanism 32, and further, the wafer W is placed on the mount base 25a of the interface 25. The wafer W is aligned with respect to the exposure section 20. Then, the wafer W is placed on the mount base 21 in the exposure 20 by a fourth convey mechanism 24. Note that a mask M is picked up from the cassette 22 by a fifth convey mechanism 23, and is held by an upper holding member (not shown). When light is irradiated through the mask M from a light source (not shown), a predetermined pattern is minified and projected onto the wafer W, thereby exposing the applied resist (in a step S12).

After the exposure processing, the wafer W is conveyed into the bake section 34b of the second processing section 30, and is subjected to pre-baking (in a steps S13). Next, the wafer W is cooled in the cooling section 34a to adjust the temperature (in a step S14). Further, the exposed resist is subjected to development processing in the development processing section 35 (in a step S15). In this state, since the second processing section 30 is provided with an air cleaning mechanism 60, alkali components such as amine generated in the first processing section 10 are exhausted to the outside together with a down flow air, and do not make bad influences on the development processing in the second processing section 30. Therefore, a formed pattern attains a high accuracy. This is particularly effective when using a resist of a chemical sensitization type.

The wafer W thus developed is conveyed into the bake section 34, to perform post-baking (in a step S16). The pattern strength of the coated resist is increased by the post-baking. In the next, the wafer W is cooled in the cooling section 34c to adjust the temperature (in a step S17). Further, the wafer W thus processed is contained into the cassette 42b at the loader/unloader section 40. When a predetermined number of wafers W are put into the cassette 42b, processed wafers W together with the cassette 42b are conveyed out of the loader/unloader section 40 (in a step S18).

Note that another processing method may be adopted in which the wafer W which has been conveyed from the loader/unloader section 40 to the first processing section 10 and has been coated with a resist is temporarily contained into the cassette 42b and is then picked up from the cassette 42b to process the wafer W in the exposure section 20 and the second processing section 30.

In addition, the first processing section 10 and the second processing section 30 may be separately operated. In this manner, resist coating processing, exposure, development processing, and sequential execution of these processing can be selectively performed in correspondence with processing. Further, wafers of different kinds in lots can be subjected to parallel processing.

Although the above embodiments have been explained supposing that the processing apparatus of the present invention is adopted in a coating/development processing system for a semiconductor wafer, the present invention is applicable to a case in which a resist solution is applied onto an LCD substrate and is subjected to exposure and development processing.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A resist processing apparatus for subjecting a substrate to resist processing in a controlled atmosphere of down-flow air, comprising:

a loader/unloader section for loading/unloading at least one cassette storing substrates therein;

a first convey mechanism provided in the loader/unloader section, and for taking out an unprocessed substrate from the cassette, and for putting a processed substrate into the cassette;

a first processing section adjoined to one side of the loader/unloader section and having a resist coating section for coating a resist on the substrate;

a second processing section adjoined to another side of the loader/unloader section so as to be separated from the first processing section and so as not to be influenced by an atmosphere of the first processing section, and having a development processing section for developing the resist coated on the substrate;

a second convey mechanism for receiving the unprocessed substrate from the first convey mechanism, for conveying the unprocessed substrate to the first processing section, and for delivering the substrate coated with a resist by the resist coating section, to the first convey mechanism; and a third convey mechanism for receiving an unprocessed substrate from the first convey mechanism, for conveying the unprocessed substrate to the second processing section, and for delivering the substrate developed by the development processing section, to the first convey mechanism.

2. The apparatus according to claim 1, wherein the at least one cassette of loader/unloader section comprises a first cassette for storing unprocessed substrates and a second cassette for storing processed substrates, and the unprocessed substrates are picked up from the first cassette by the first convey mechanism and the processed substrates are stored in the second cassette by the first convey mechanism.

3. The apparatus according to claim 1, further comprising:

a first heat treatment section provided in the first processing section, for subjecting substrates to a heat treatment before and after resist coating; and a second heat treatment section provided in the second processing section, for subjecting substrates to a heat treatment before and after development processing, wherein a passage for the second convey mechanism is provided between the first heat treatment section and the resist coating section, and a passage for the third convey mechanism is provided between the second heat treatment section and the development processing section.

4. The apparatus according to claim 1, further comprising an adhesion processing section provided in the first processing section, for subjecting substrates to adhesion processing before resist coating.

5. The apparatus according to claim 1, further comprising:

a down air flow generation means for creating a down flow of air flowing from an upper portion to a lower portion of the second processing section; and a chemical filter provided at an upper portion of the development processing section, for eliminating an alkali component from the down flow of air.

6. The apparatus according to claim 5, wherein said down air flow generation means comprises:

a duct communicating with an upper portion of the second processing section;

an air conditioner for supplying cleaned air to the second processing section;

an air fan provided at an upper portion of the development processing section, for feeding air supplied through the duct, in a downward direction; and a physical filter provided in a downstream side of the air fan, for eliminating particles from the air.

7. The apparatus according to claim 1, further comprising an exposure processing section provided at a side portion of the second processing section, for exposing substrates coated with resist with light.

8. The apparatus according to claim 7, further comprising a common cassette convey means for conveying a substrate cassette in the loader/unloader section and an exposure mask cassette in the exposure processing section, said substrate cassette and exposure mask cassette being substantially disposed in a line.

9. The apparatus according to claim 1, further comprising an exposure processing section provided at a side portion of the loader/unloader section, for exposing the applied resist with light.

10. A resist processing method for subjecting a substrate to resist processing in a controlled atmosphere of down-flow air, comprising:

(a) loading a cassette with substrates stored therein into a loader/unloader section;

(b) unloading a substrate from the cassette and conveying the substrate to a first processing section;

(c) washing the substrate conveyed to the first processing section;

(d) coating resist on the washed substrate;

(e) baking the resist coated on the substrate;

(f) exposing the resist coated on the substrate with light;

(g) conveying the exposed substrate to a second processing section located separate from the first processing section with the loader/unloader section interposed therebetween;

(h) developing the exposed substrate at the second processing section sufficiently separate from the first processing section where the resist coating step (d) is performed, so that an atmosphere of the resist coating step (d) does not have a substantial influence on the developing step (h).

11. The method according to claim 10, further comprising a step of forming a reflection prevention film on the substrate before the resist coating step (d).

12. The method according to claim 10, further comprising a step of subjecting the substrate to adhesion processing before the resist coating step (d).

13. The method according to claim 10, wherein the development step (h) further comprises the step of developing the exposed substrate in an atmosphere of a down flow of clean air from which alkali components have been eliminated.

* * * * *